United States Patent [19]

Hasegawa et al.

[11] Patent Number: 4,713,284

[45] Date of Patent: Dec. 15, 1987

[54] CERAMIC COATED LAMINATE AND PROCESS FOR PRODUCING THE SAME

[75] Inventors: Hiroshi Hasegawa, Shimodate; Mitsuhiro Inoue, Oyama, both of Japan

[73] Assignee: Hitachi Chemical Co., Ltd., Tokyo, Japan

[21] Appl. No.: 943,695

[22] Filed: Dec. 19, 1986

[30] Foreign Application Priority Data

Dec. 26, 1985 [JP] Japan .................................. 60-295798
Feb. 12, 1986 [JP] Japan .................................. 61-28698

[51] Int. Cl.$^4$ ............................................. B32B 7/00
[52] U.S. Cl. .................................... 428/246; 156/247; 156/285; 427/423; 428/209; 428/210; 428/251; 428/252; 428/901
[58] Field of Search .............. 428/209, 210, 246, 251, 428/252, 901; 427/190, 230, 423; 156/247, 285

[56] References Cited

U.S. PATENT DOCUMENTS 4,501,787 2/1985 Marchetti et al. ................ 428/215

OTHER PUBLICATIONS

"Plasma Flame Sprayed Substrate," Intern. Microelectronics Conf., 1982, pp. 234-240.

*Primary Examiner*—Marion C. McCamish
*Attorney, Agent, or Firm*—Antonelli, Terry & Wands

[57] ABSTRACT

Ceramic coated laminates for printed circuit boards produced by flame spraying a ceramic powder on a metal plate such as copper foil or a woven fabric prepreg, laminating one or two ceramic coated metal plates and woven fabric prepregs so as to place the ceramic layer between the metal plate and the prepreg, hot-pressing the laminated members, and if necessary peeling off the metal plate(s), are excellent in thermal conductivity and heat resistance.

15 Claims, 6 Drawing Figures

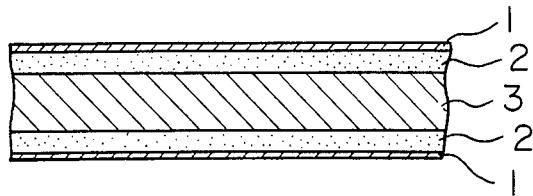
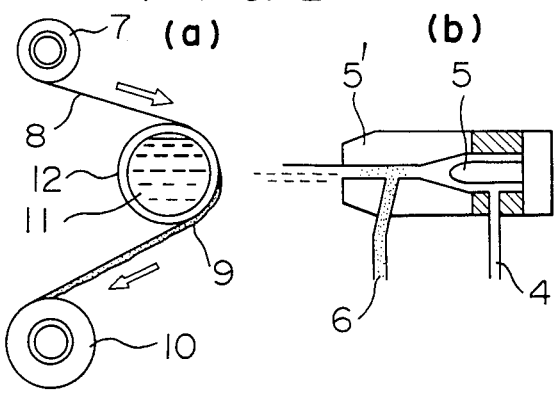
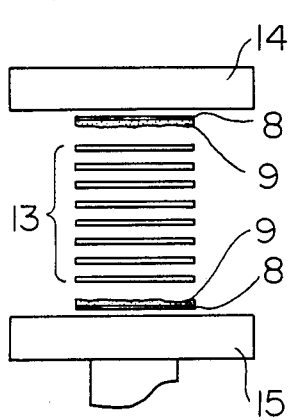
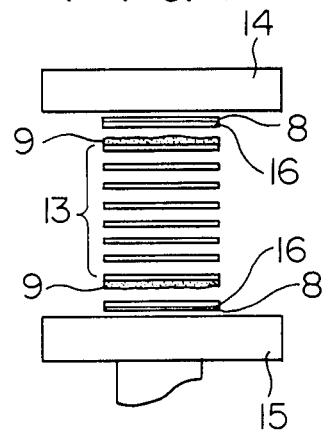

F I G. 5
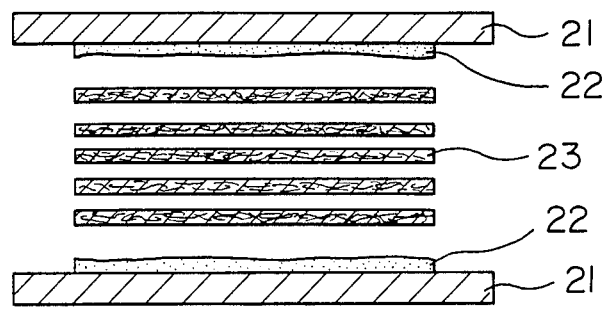
F I G. 6
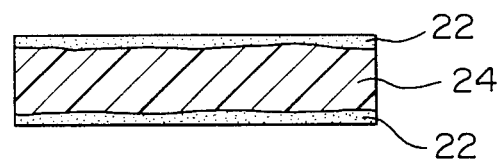

CERAMIC COATED LAMINATE AND PROCESS FOR PRODUCING THE SAME

BACKGROUND OF THE INVENTION

This invention relates to ceramic coated laminates for printed wiring boards excellent in heat resistance and thermal conductivity, and a process for producing the same.

Heretofore, as printed wiring boards, there have widely been used phenol resin laminates and epoxy resin laminates. But with a recent demand for high density packaging of parts caused by higher performance and miniaturization of electronic devices, there arises a problem how to treat high-density generation of the heat thus generated. Since these conventional organic material substrates are poor in heat dissipation properties due to poor thermal conductivity and also poor in heat resistance, it was difficult to use these organic material substrates for high-density packaging. Thus, as substrates having excellent thermal conductivity, there have been noticed alumina and the like ceramic substrates, metal core substrates obtained by coating a metal plate as a core with an insulating layer. Further, from the viewpoint of heat resistance, there have been developed substrates obtained by using heat resistant resins such as polyimides, polyetherether-ketones, polysulfones, and the like in place of conventional phenol resins and epoxy resins.

But these substrates have many problems. For example, the substrates made of ceramic such as alumina, silicon carbide, beryllia, etc. are excellent in thermal conductivity and heat resistance, but they have defects in that production steps are complicated, the workability is poor, mechanical strength is low, a large size substrate cannot be obtained due to the limitation to the size of substrate, and the like. The metal core substrates obtained by forming woven fabric reinforced resin layers on surfaces of a metal plate core cannot sufficiently use the high thermal conductivity of the metal core and thus are insufficient in heat dissipation properties, since the insulating layer made from a resin having low thermal conductivity contacts with electrical conductive portions which is to be formed into a circuit. Further, since the core material is made of a metal, the formation of through holes is not easy and requires very complicated production steps. As to the heat resistant resin substrates, they are improved in the heat resistance, but good heat dissipation properties cannot be expected due to low thermal conductivity of the resins.

In order to improve these disadvantages mentioned above, there is proposed a process wherein a ceramic is plasma flame sprayed on an ordinary printed circuit substrate to form an insulating layer good in thermal conductivity, and an electrical circuit is formed thereon (Japanese Patent Unexamined Publication No. 60-62186). But when a ceramic is simply flame sprayed on an ordinary printed circuit substrate, the adhesiveness between the ceramic layer and the substrate is not sufficient due to the difference in thermal expansion coefficients of the ceramic layer and the substrate, and the like. Thus, the formation of electrical circuits sufficient in reliability is difficult. Further, when a thicker ceramic layer is formed in order to improve the heat conductivity, there arises a problem in that the ceramic layer is peeled off from the ordinary substrate due to the difference in thermal expansion, and the like.

SUMMARY OF THE INVENTION

It is an object of this invention to provide a ceramic coated laminate overcoming the defects mentioned above, being able to be processed in the same manner as in the conventional organic material substrates, and excellent in thermal conductivity and heat resistance, and a process for producing the same.

This invention provides a ceramic coated laminate comprising a woven fabric prepreg layer, one or a pair of ceramic flame sprayed layers bonded to the woven fabric prepreg layer and one or a pair of copper foils bonded to the ceramic flame sprayed layers.

This invention also provide a ceramic coated laminate produced by flame spraying a ceramic on a surface of a metal plate to form a ceramic layer thereon, sandwiching a number of woven fabric prepregs between a pair of the ceramic coated metal plates so as to contact the ceramic layers with the prepregs, or laminating a number of woven fabric prepregs on the ceramic coated metal plate so as to contact the ceramic layer with a prepreg, hot-pressing the resulting laminated members, and peeling off the metal plate or plates, and a process for producing the same.

BRIEF DESCRIPTION OF THE DRAWINGS

FIG. 1 is a cross-sectional view of one example of the ceramic coated laminate of this invention.

FIG. 2 is a schematic view showing a ceramic flame spraying step.

FIG. 3 and FIG. 4 are cross-sectional views showing a step of hot-pressing ceramic coated laminates.

FIG. 5 is a cross-sectional view showing another example of a laminate construction.

FIG. 6 is a cross-sectional view of another example of the ceramic coated laminate of this invention.

DESCRIPTION OF THE PREFERRED EMBODIMENTS

FIG. 1 is a cross-sectional view of a copperclad ceramic coated laminate of this invention wherein numeral 1 denotes a copper foil, numeral 2 denotes a ceramic flame sprayed layer, and numeral 3 denotes a laminate layer obtained by laminating and curing a predetermined number of plies of woven fabric prepreg.

As the resin for the woven fabric prepreg, epoxy resins and polyimide resins can preferably be used from the viewpoint of electrical properties, moldability and processability. It is also possible to use thermosetting resins such as phenol resins, unsaturated polyester resins, melamine resins, vinylester resins, etc., and thermoplastic resins such as polysulfones, polyether ether ketones, polyether sulfones, polyetherimides, etc.

As the fibers for the woven fabric, there can be used conventionally used glass fibers, aramide fibers, Kevlar fibers (a trademark, mfd. by E. I. du Pont de Nemours & Co.), paper, SiC fibers, silica fibers, etc.

The woven fabric prepreg can be prepared by a conventional method.

The resulting copper-clad laminates according to this invention can be a single-sided copper-clad laminate or a double-sided copper-clad laminate.

As to the ceramic, those containing alumina or silicon carbide solely or as a main component are preferable from the viewpoint of electrical insulating properties and thermal conductivity. It is also possible to use other ceramics such as aluminum nitride, spinel, mullite, beryllia, etc., good in thermal conductivity and electrical insulating properties depending on required properties.

The flame spraying of ceramic can be carried out by projecting a ceramic powder through a high temperature atmosphere so as to make the creamic powder molten state with heating instantly and bonding the molten powder to a surface of object to be coated by a conventional method. More concretely, there can be used a plasma flame spraying method using a plasma flame sprayer, a gas flame spraying method, a water plasma spraying method, and the like.

It is preferable to use the ceramic powder having a particle size of 10 to 50 μm in general.

The thickness of the ceramic flame sprayed layer is preferably 20 to 500 μm, more preferably 20 to 200 μm. When the thickness is less than 20 μm, sufficient effects on the heat resistance and thermal conductivity cannot be obtained, while when the thickness is more than 500 μm, workability such as drilling workability becomes worse and the cost is undesirably raised.

The ceramic flame sprayed layer can be formed by either flame spraying a ceramic powder on a copper foil or flame spraying the ceramic powder on one side of the woven fabric prepreg. In the former case, one or more woven fabric prepregs are sandwiched between the ceramic flame sprayed layers on the copper foils (in the case of double-sided) or laminated on the ceramic flame sprayed layer on the copper foil (in the case of single-sided) and hot-pressed. In the latter case, one or a pair of copper foils coated with an adhesive are placed on one or a pair of the ceramic flame sprayed layers of the woven fabric prepregs while sandwiching or laminating a predetermined number of woven fabric prepregs between or on the non-flame sprayed sides or side of the woven fabric prepregs or prepreg, and hot-pressed.

The hot-pressing can be carried out by a conventional method used for producing usual laminated substrates for printed wiring boards.

More concretely, in the production of a double-sided copper clad ceramic coated laminate using copper foils one side of which has been flame sprayed by a ceramic powder, as shown in FIG. 2, an argon gas 4 is passed to a plasma flame sprayer, a voltage is applied to electrodes 5 and 5' to generate plasma by arcing, and at the same time a ceramic powder 6 supplied is melted by the high temperature of the plasma, and the molten ceramic is projected. The molten ceramic is bonded and deposited on a copper foil 8 sent from a delivery roll 7 to form a ceramic flame sprayed layer 9 on the copper foil. The copper foil thus flame sprayed with the ceramic is winded up successively by a wind-up roll 10 to produce the ceramic flame sprayed copper foil continuously. The temperature of the flame sprayed portion of copper foil is controlled by a cooling roll 12 in which cooling water 11 is passed so as to prevent the generation of wrinkles due to thermal expansion of the copper foil. Then, as shown in FIG. 3, a predetermined number (e.g. 6 sheets) of woven fabric prepregs 13 (e.g. having a thickness of 0.2 mm) are placed between the copper foils 8 having the ceramic flame sprayed layers 9. The resulting laminated material is sandwiched between an upper heating platen 14 and a lower heating platen 15 and hot-pressed (e.g. at 170° C., 50 kg/cm² for 2 hours) to give the desired ceramic coated laminate.

In the case of producing a double-sided copper clad ceramic coated laminate using woven fabric prepregs one side of which has been flame sprayed by a ceramic powder, the ceramic powder is flame sprayed on a woven fabric prepreg in the same manner as mentioned above. Then, as shown in FIG. 4, the woven fabric prepregs having the ceramic flame sprayed layers 9 thereon sandwiching a predetermined number of woven fabric prepregs between non-flame sprayed sides thereof are placed between copper foils 8 having an adhesive layers 16 which are to be contacted with the ceramic flame sprayed layers. The resulting laminated material is sandwiched between an upper heating platen 14 and a lower heating platen 15 and hot-pressed to give the desired ceramic coated laminate.

In the same manner as mentioned above, a single-side copper clad ceramic coated laminate can be produced.

The ceramic coated laminate of the present invention has improved adhesiveness between the ceramic layer and the prepreg layer. One reason for this seems to be as follows. When the ceramic flame sprayed copper foils sandwiching a number of woven fabric prepregs are hot-pressed, or the copper foils having adhesive layers sandwiching the ceramic flame sprayed woven fabric prepregs interposing therebetween a number of woven fabric prepregs are hot-pressed, the resin in the prepregs is made to have a low viscosity at the initial stage of the molding and impregnates into pores in the ceramic flame sprayed layers. By curing the resin in such a state, the resin functions as an adhesive for the prepreg layer and the ceramic layer and at the same time increases the adhesiveness by mechanical actions.

Further, by sealing the pores in the ceramic flame sprayed layer with the resin which has impregnated into the pores, the adhesiveness is improved and at the same time various properties such as dielectric strength, water resistance, etc. of the ceramic flame sprayed layer are improved.

In addition, the thickness of a ceramic coating layer cannot be enlarged according to a prior art process from the viewpoint of adhesiveness. But according to this invention, the thickness of the ceramic layer can be enlarged without lowering the adhesiveness while improving thermal conductivity and heat dissipation properties.

On the other hand, a ceramic coated laminate having no copper foils on the surfaces can be produced by the present invention. That is, a ceramic is flame sprayed on a metal plate to form a ceramic layer thereon, a number of woven fabric prepregs are sandwiched between a pair of the ceramic coated metal plates so as to contact the ceramic layers with the prepregs, or laminating a number of woven fabric prepregs on the ceramic coated metal plate so as to contact the ceramic layer with a prepreg, the resulting laminated members are hot-pressed and the metal plate(s) are peeled off. The thus produced ceramic coated laminate is improved in adhesiveness between the ceramic layer and the prepreg layer and good in smoothness of the outermost ceramic layers.

In general, a ceramic which is an inorganic material and a resin which is an organic material are poor in adhesiveness each other due to differences in materials and thermal expansion coefficients. Therefore, when a ceramic is flame sprayed on a surface of a substrate made from an organic material after molding, it is difficult to obtain the sufficient adhesiveness. Further, since the surface of a flame sprayed layer is rough as it is, so that the surface should be subjected to a polishing treatment to make it smooth in order to form an electric circuit thereon.

But, according to this invention, since the ceramic coated laminate is produced by flame spraying a ceramic on a metal plate, sandwiching a number of woven fabric prepregs between a pair of the ceramic coated metal plates, hot-pressing the resulting laminated members, and peeling off the metal plates, the resin in the prepregs melts in a low viscosity state, impregnates in pores present in the rough flame sprayed ceramic layer, and cures therein, so that the adhesive area increases to provide good adhesiveness. Further, since the metal plate is removed after the hot-pressing, the ceramic flame sprayed layer appeared on the surface has a smooth surface since the surface of the metal plate is transferred as it is, so that no polishing treatment is necessary and electrical circuits can be formed thereon without any treatment.

As the metal plate, there can be used an iron plate, an aluminum plate, a stainless steel plate, and the like.

In order to peel off the metal plate from the ceramic layer easily, it is preferable not to conduct blasting of the metal plate before the flame spraying or to conduct the blasting slightly. In order to peel off the metal plate more easily, it is effective to subject the metal plate to a mold release treatment by coating thereon a mold release agent such as a silicone type or fluorine type mold release agent conventionally used in molding of plastics.

As mentioned above, a laminate having ceramic layers on both sides of an organic material substrate (prepreg) can readily by obtained. According to this embodiment, since the ceramic flame sprayed layer is formed on the metal plate and prepregs are sandwitched between a pair of the ceramic coated metal plates, followed by hot-pressing, the adhesiveness between the ceramic layer and the prepreg layer is very good. Further, since the smooth surface of metal plate is transferred to the surface of ceramic layer as it is, the surface of the resulting ceramic coated laminate is very smooth and electrical circuits can be formed thereon without any treatment.

The above-mentioned embodiment is explained in more detail referring to the attached drawings.

FIG. 5 is a cross-sectional view of a laminate construction and FIG. 6 is a cross-sectional view of a ceramic coated laminate.

After coating a silicon type mold release agent on a surface of stainless steel plate 21 (2 mm thick) having smooth surfaces, an alumina layer 22 having a thickness of about 100 $\mu$m is formed thereon by flame spraying alumina using a plasma flame sprayer. A pair of the thus treated stainless steel plates and glass cloth/epoxy resin impregnated prepregs 23 (e.g. 6 sheets each having a thickness of 0.2 mm) are laminated as shown in FIG. 5 and hot-pressed (e.g. at 170° C., 50 kg/cm² for 2 hours). After cooling the resulting molded article, the stainless steel plates are peeled off to give a laminate having alumina layers on the surfaces thereof as shown in FIG. 6. In the same manner as mentioned above, a single-side ceramic coated laminate can be produced.

The resulting ceramic (alumina) coated laminate has smooth alumina layers and the adhesiveness between the alumina layer and the epoxy resin (prepreg layer) is good. Since the ceramic coated laminate has the alumina layers good in thermal conductivity on the surfaces thereof, it is excellent in heat dissipation properties and good in heat resistance, arc resistance and tracking resistance. Further, since the core of this laminate is glass/epoxy substrate conventionally used, the formation of through holes and drilling working can be carried out by methods conventionally used.

According to this invention, ceramic coated laminates having excellent thermal conductivity and heat resistance can readily be produced. Further, the resulting laminates have both excellent moldability and workability which are derived from the organic substrates (woven fabric resin impregnated prepregs) and excellent heat resistance and thermal conductivity which are derived from the ceramic substrates (ceramic flame sprayed layers), and overcoming disadvantages derived from both the organic substrates and the ceramic substrates.

What is claimed is:

1. A ceramic coated laminate comprising a woven fabric prepreg layer, one or a pair of ceramic flame sprayed layers bonded to the woven fabric prepreg layer and one or a pair of copper foils bonded to the ceramic flame sprayed layers.

2. A ceramic coated laminate according to claim 1, wherein the ceramic layer is formed on a copper foil by flame spraying and molding of the ceramic coated laminate is conducted by hot-pressing.

3. A ceramic coated laminate according to claim 1, wherein the ceramic layer is formed on a woven fabric prepreg by flame spraying and molding of the ceramic coated laminate is conducted by hot-pressing using one or a pair of copper foils having an adhesive layer at an inside thereof.

4. A ceramic coated laminate according to claim 1, wherein a woven fabric in the woven fabric prepreg layer is a glass fiber.

5. A ceramic coated laminate according to claim 1, wherein a woven fabric in the woven fabric prepreg layer is an aramide fiber.

6. A ceramic coated laminate according to claim 1, wherein a resin in the woven fabric prepreg layer is an epoxy resin.

7. A ceramic coated laminate according to claim 1, wherein a resin in the woven fabric prepreg layer is a polyimide resin.

8. A ceramic coated laminate according to claim 1, wherein alumina powder is used solely or as a main component in a ceramic powder.

9. A ceramic coated laminate according to claim 1, wherein silicon carbide powder is used solely or as a main component in a ceramic powder.

10. A ceramic coated laminate produced by flame spraying a ceramic on a surface of a metal plate to form a ceramic layer thereon, sandwiching a number of woven fabric prepregs between a pair of the ceramic coated metal plates so as to contact the ceramic layers with the prepregs, or laminating a number of woven fabric prepregs on the ceramic coated metal plate so as to contact the ceramic layer with a prepreg, hot-pressing the resulting laminated members, and peeling off the metal plate or plates.

11. A ceramic coated laminate according to claim 4, wherein a woven fabric in the woven fabric prepregs is a glass fiber.

12. A ceramic coated laminate according to claim 4, wherein a resin in the woven fabric prepregs is a polyimide.

13. A ceramic coated laminate according to claim 4, wherein allumina powder is used solely or as a main component in a ceramic powder.

14. A process for producing a ceramic coated laminate, which comprises flame spraying a ceramic powder on a surface of a metal plate to form a ceramic layer thereon, sandwiching a number of woven fabric prepregs between a pair of the ceramic coated metal plates so as to contact the ceramic layers with the prepregs, or laminating a number of woven fabric prepregs on the ceramic coated metal plate so as to contact the ceramic layer with a prepreg, hot-pressing the resulting laminated members, and peeling off the metal plate or plates.

15. A process according to claim 14, wherein the metal plate surface to be flame sprayed is previously subjected to a mold release treatment.

* * * * *